Jan. 4, 1966 M. JACOBY 3,227,368

BINARY COUNTER

Filed Jan. 22, 1964

INVENTOR

MARVIN JACOBY

BY Griffin and Stokes

ATTORNEYS

United States Patent Office 3,227,368
Patented Jan. 4, 1966

3,227,368
BINARY COUNTER

Marvin Jacoby, Fort Washington, Pa., assignor to Sperry Rand Corporation, New York, N.Y., a corporation of Delaware Filed Jan. 22, 1964, Ser. No. 339,507
12 Claims. (Cl. 235—201)

The present invention relates to binary counters and more particularly to binary counters employing pure fluid amplifiers and having no moving parts.

An object of the invention is to provide pure fluid operated binary counters responsive to a sequence of fliud input signals for alternately producing fluid signals at first and second outputs. A feature of the invention present in all embodiments is the provision of a single bistable fluid flop-flop for each counter stage, dynamic delay means for delaying output signals produced by the flip-flop, and first and second logical gating means responsive to the sequence of input signals and the delayed signals for changing the state of the flip-flop. In one embodiment each gating means comprises a logical NOR circuit and in another embodiment each gating means comprises a logical AND circuit.

An object of the present invention is to provide a pure fluid operated binary counter wherein each stage includes two logical NOR circuits and a single bistable flip-flop circuit. Each NOR circuit has one input connected to a fluid source which produces a predetermined signal each time the counter is to be advanced. The output of each NOR circuit is connected to one input of the bistable flip-flop which in turn produces output signals which are applied to second inputs of the the NOR circuits. A feature of the invention is the provision of dynamic delay means for delaying the output signals produced by the flip-flop before they are applied to the NOR circuits.

Another object of the invention is to provide a pure fluid counter comprising first and second logical NOR circuits having first and second inputs, means for simultaneously applying a fluid signal to said first inputs each time the count is to be advanced, a bistable flip-flop having first and second inputs responsive to output signals produced by said first and second NOR circuits, and means including dynamic fluid delay means for applying output signals produced by said bistable flip-flop to the second inputs of said NOR circuits.

Another object of the invention is to provide a pure fluid operated binary counter stage comprising two logical AND circuits and a single bistable flip-flop circuit. Each AND circuit has one input connected to a fluid source which produces a predetermined signal each time the counter stage is to be advanced. The output of each AND circuit is connected to one input of the flip-flop which in turn produces output signals which are delayed and applied to second inputs of the AND circuits.

Still another object of the invention is to provide a pure fluid counter comprising first and second logical AND circuits having first and second inputs, means for simultaneously applying a fluid signal to said first inputs each time the count is to be advanced, a bistable flip-flop having first and second inputs responsive to output signals produced by said first and second AND circuits, and means including dynamic fluid delay means for applying output signals produced by the flip-flop to the second inputs of the AND circuits.

Other objects of the invention and its mode of operation will become apparent upon consideration of the following description and the accompanying drawings in which.

Figure 1:
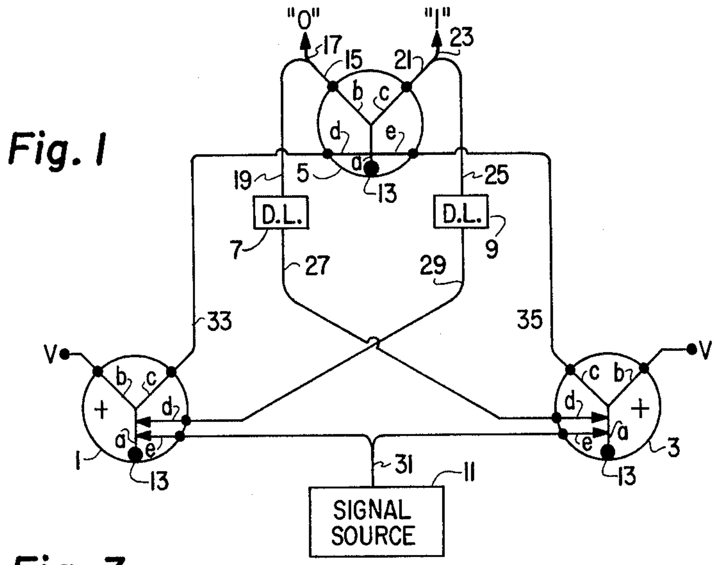
FIGURE 1 is a schematic diagram of a binary counter stage employing logical NOR gating means.

A first embodiment of the invention is illustrated in schematic form in FIGURE 1 and comprises first and second pure fluid operated logical NOR circuits 1 and 3, a bistable fluid amplifier or flip-flop 5, first and second dynamic fluid delay means 7 and 9, and a signal source 11.

Fluid amplifier NOR circuits 1 and 3 may, for example, be of the type shown on page 408 of the publication entitled "Proceedings of the Fluid Amplification Symposium," volume I, October 1962, distributed by the Office of Technical Services of the U.S. Department of Commerce.

Each NOR circuit is a fluid amplifier which includes a power stream input nozzle "*a*," first and second output channels "*b*" and "*c*" and first and second control or input nozzles "*d*" and "*e*."

Referring now to NOR circuit 1, power stream nozzle 1*a* is connected to a source which supplies a substantially constant stream of fluid. This source is designated in the drawing by the numeral 13 and may, for example, be a pressure regulated fluid source of known design. NOR circuit 1 is geometrically biased so that in the absence of flow of control fluid in both nozzles 1*d* and 1*e* the power stream fluid flows from nozzle 1*a* into output channel 1*c*.

When fluid is applied to either one or both of the control nozzles 1*d* and 1*e*, the power stream fluid is diverted so that it flows from nozzle 1*a* into output channel 1*b*. The amplifier is monostable, its power stream being diverted into channel 1*b* only as long as there is control fluid flowing into at least one of the nozzles 1*d* and 1*e*. Thus, there is power stream flow into channel 1*c* only during those intervals when control signals manifested by the absence of fluid flow are being applied concurrently to both nozzle 1*d* and nozzle 1*e*.

NOR circuit 3 operates in the same manner as NOR circuit 1. Its power nozzle 3*a* is connected to a continuous source of power stream fluid 13 and, in the absence of any control fluid flow at nozzles 3*d* and 3*e*, the power stream fluid flows from nozzle 3*a* into output channel 3*c*. Upon occurrence of a control fluid flow at either or both of the nozzles 3*d* and 3*e* the power stream is diverted into output channel 3*b*. As soon as the control flow at nozzle 3*d* and 3*e* ceases the power stream returns to its normal path of flow into channel 3*c*.

Bistable pure fluid amplifier 5 may be of the type shown on page 20 of the aforementioned publication. The amplifier includes a power nozzle 5*a*, first and second output channels 5*b* and 5*c* and first and second control nozzles 5*d* and 5*e*. Power nozzle 5*a* is connected to source 13 which supplies a substantially constant stream of fluid to the nozzle. As explained in the publication, the amplifier has a first stable state manifested by power stream flow from nozzle 5*a* into output channel 5*b*. This condition is also called the "reset" or "zero" state of the amplifier. The amplifier has a second stable state manifested by power stream flow from nozzle 5*a* into output channel 5*c* and this state is sometimes referred to as the "set" or "one" state. Bistable amplifier 5 may be switched from the reset to the set state by applying a signal manifested by fluid flow to control nozzle 5*e*. Once the amplifier is switched to a predetermined state by a signal applied to one of the control nozzles 5*d* and 5*e* it remains in that state until a signal is applied to the other control nozzle.

When amplifier 5 is in the reset state the power stream fluid flowing into output channel 5*b* enters a pipe 15.

This pipe is connected with pipes 17 and 19. When amplifier 5 is in the set state the power stream fluid flowing into output channel 5*c* enters a pipe 21 and flows through this pipe into pipes 23 and 25. Pipe 17 and/or pipe 23 may be connected to an output device such as an indicator for providing an indication of the state of the counter. These pipes may also be connected to further counter stages similar to the one shown to provide a multiple stage counter system.

A portion of the fluid signal entering pipe 15 is conveyed by means of pipe 19 to dynamic fluid delay element 7 and after emerging from the delay element travels over a pipe 27 to control nozzle 3*d*. In like manner, a portion of the fluid signal entering pipe 21 is conveyed by means of pipe 25 to dynamic fluid delay element 9 and after emerging from the delay element travels over a pipe 29 to control nozzle 1*d*. Dynamic delay elements 7 and 9 may comprise fluid chambers, long lines, or any other suitable means which transmits a fluid signal from its output a predetermined interval of time after the signal is received at its input.

A complete cycle of operation of the counter will now be described. Assume that the counter stage is in the reset condition. The power stream of amplifier 5 flows from output channel 5*b* through pipes 15 and 19, delay element 7, and pipe 3*d* to deflect the power stream of NOR circuit 1 into channel 3*b*. Signal source 11 normally supplies fluid over pipe 31 to control nozzles 1*e* and 3*e* thus inhibiting or disabling NOR circuits 1 and 3 by deflecting their power streams away from output channels 1*c* and 3*c* into output channels 1*b* and 3*b*. Output channels 1*b* and 3*b* are vented to the atmosphere at V. Therefore, before the first count signal is received from source 11 amplifier 5 is in the reset state and neither of the NOR circuits 1 and 3 is applying an output signal to amplifier 5.

Figure 3:
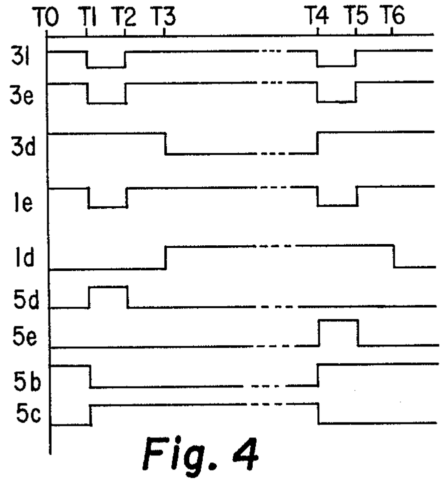

The counter actually counts the number of signals produced by source 11, these signals being manifested by the absence of fluid flow from source 11 into pipe 31. As illustrated in FIGURE 3, the first count signal on pipe 31 begins at time T1 when fluid flow into pipe 31 ceases. Also, since control nozzles 1*e* and 3*e* are connected to pipe 31 these nozzles stop producing control streams at time T1.

In NOR circuit 3 the control nozzle 3*d* continues to produce a control stream since this nozzle is still receiving fluid from channel 5*b* of the bistable amplifier. Therefore, the power stream of NOR circuit 3 remains deflected into channel 3*b* even after fluid flow at nozzle 3*e* terminates.

Nozzle 1*d* of NOR circuit 1 is not receiving fluid from amplifier 5 at time T1. Therefore, when the fluid applied to nozzle 1*e* stops flowing at time T1 the power stream of the NOR circuit assumes its normal path of flow into output channel 1*c*. This output channel is connected by means of pipe 33 to control nozzle 5*d* so the output fluid from NOR circuit 1 switches amplifier 5 to the set state. When amplifier 5 is set the fluid flow into output channel 5*b* is terminated and fluid flow into output channel 5*c* begins. The resulting fluid flow into pipe 23 may be utilized to actuate an indicator to thereby indicate that the counter stage is set.

At time T2 the first input signal is terminated when source 11 again applies fluid to pipe 31. This fluid is applied to nozzles 1*e* and 3*e*. The fluid applied to nozzle 1*e* deflects the power stream of NOR circuit 1 to output channel 1*b* thus terminating the signal applied to nozzle 5*d*. Because of its bistable characteristic amplifier 5 remains set even after the signal at 5*d* terminates.

The fluid applied to nozzle 3*e* has no effect on NOR circuit 3 because, as subsequently explained, a control signal at nozzle 3*d* is already deflecting the power stream of this NOR circuit into output channel 3*b*.

Delay unit 9 delays the output stream which is initiated in channel 5*c* as amplifier 5 is set at time T1. The fluid flowing into channel 5*c* moves through pipes 21 and 25 and enters delay unit 9. At time T3 delay unit 9 produces an output stream on pipe 29 and this stream is applied by way of pipe 29 to control nozzle 1*d*. This is illustrated in FIGURE 3 where the waveform representing the signal magnitude at 1*d* shifts from a low level to a high level. The fluid stream applied to nozzle 1*d* at time T3 has no appreciable effect on NOR circuit 1 because the power stream of this circuit is already being deflected into channel 5*b* by the fluid supplied to nozzle 1*e*.

As stated before, the first input pulse from source 11 causes amplifier 5 to be set at time T1. The power stream flow into output channel 5*b* terminates at this time. However, because of delay element 7 the flow of fluid at nozzle 1*d* does not terminate until time T3. At this time source 11 is applying fluid to nozzle 3*e* to deflect the power stream of NOR circuit 3 into channel 3*b* so termination of flow at nozzle 1*d* has no appreciable effect on the NOR circuit.

The response of the counter stage to the first input signal is completed shortly after time T3 when the flow conditions in nozzles 1*d* and 3*d* become stabilized. Nothing further happens in the counter stage until signal source 11 again manifests an input signal by terminating fluid flow in pipe 31. As indicated by the broken lines in FIGURE 3 the second input signal may occur anytime after T3.

At time T4 signal source 11 again produces an output signal and fluid flow terminates in pipe 31 and nozzles 1*e* and 3*e*. Fluid is flowing from channel 5*c* to nozzle 1*d* thus deflecting the power stream of NOR circuit 1 into channel 1*b* so termination of fluid flow at nozzle 1*e* has no effect on this NOR circuit. On the other hand, in NOR circuit 3 there is no control fluid being applied to nozzle 3*d* so when fluid flow to nozzle 3*e* terminates the power stream switches so that it flows into channel 5*c*. This flow passes through pipe 35 and is applied to control nozzle 5*e* thus switching the bistable amplifier from the set to the reset state.

At time T5 signal source 11 again applies fluid to nozzles 1*e* and 3*e*. NOR circuit 1 does not switch because it is already receiving fluid at nozzle 1*d*. The power stream of NOR circuit 3 is switched by the fluid applied to nozzle 1*e* and flows into channel 3*b*.

When the power stream of NOR circuit 3 switches into channel 3*b* the input signal to nozzle 5*e* terminates but amplifier 5 remains in the reset state because of its bistable characteristic.

At time T4 when bistable amplifier 5 switches to its reset state its power stream flow into channel 5*c* creases and power stream flow into channel 5*b* begins. Thus, fluid flow into delay unit 9 ceases and fluid flow into delay unit 7 begins at time T4. Because of the delays inherent in units 7 and 9 these changes in flow are not evident at nozzles 1*d* and 3*d* until time T6.

At time T6 fluid flow into control nozzle 1*d* ceases but because of the control flow present at nozzle 1*e* the power stream of NOR circuit 1 continues flowing into channel 1*b*. At time T6 fluid flow into nozzle 1*d* begins but has no effect since the power stream of NOR circuit 3 is already being deflected into channel 3*b* by the signal present at nozzle 1*e*.

This completes one cycle of operation of the counter stage and it is ready to receive a third input signal from source 11 to begin another cycle. From the above description it is seen that if a series of input signals is applied to the counter stage the first and succeeding odd numbered signals set amplifier 5 while the second and succeeding even numbered signals reset the amplifier. This corresponds to the operation of modulo-2 or binary counter stages.

The delay units 7 and 9 should be chosen such that they delay fluid signals applied thereto for a period of time at least as long as the duration of each input signal produced by source 11. If the delay time of these units is less than the duration of an input signal then the bistable amplifier 5 may change state more than one time in response to a single input signal. The input signals produced by source 11 should be as short as possible and should have a duration just great enough to insure the switching of the bistable amplifier. Furthermore, the interval between input signals should be greater than the delay caused by delay units 7 or 9.

In order to reset the counter stage to zero it may be desirable to provide another control nozzle (not shown) for switching amplifier 5. The additional nozzle should be disposed on the same side of the power stream as nozzle 5*e* and should be connected to a source which supplies a fluid control signal each time the counter stage is to be reset.

Figure 2:
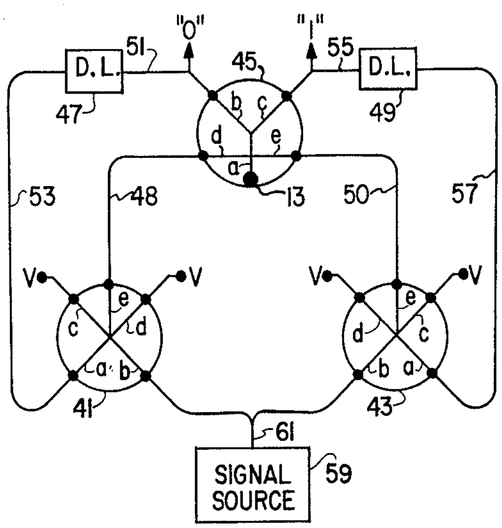
FIGURE 2 is a schematic diagram of a binary counter stage employing logical AND gating means; and, FIGURES 3 and 4 are timing diagrams illustrating the operation of the devices shown in FIGURES 1 and 2, respectively.

FIGURE 2 shows an embodiment of the invention suitable for counting fluid signals represented by the presence of fluid flow. A single counter stage comprises first and second logical AND circuits 41 and 43, a single fluid flip-flop 45, and first and second delay means 47 and 49.

Any suitable fluid AND circuits may be used but preferably the AND circuits are of the type described on page 7 of the publication entitled "Fluid Amplification—Section 9, Logic Elements" prepared by Harry Diamond Laboratories and available through the Office of Technical Services, U.S. Department of Commerce. These AND circuits are passive elements having no power stream input. The output signals comprise only the fluid of the input signals.

Each AND circuit has two input nozzles "*a*" and "*b*" and three output channels "*c*," "*d*," and "*e*". The inputs and outputs are arranged so that if fluid streams are concurrently applied to nozzles "*a*" and "*b*" they collide and, through momentum exchange, are deflected so that the fluid of both streams enters output channel "*e*". A signal in this channel represents the logical AND function.

A fluid stream applied to nozzle "*a*" exits through output channel "*d*" if a stream is not concurrently applied to nozzle "*b*". A fluid stream applied to nozzle "*b*" exits through output channel "*c*" if a stream is not concurrently applied to nozzle "*a*." The fluid streams entering channels "*c*" and "*d*" are vented to the atmosphere at points V.

Output channels 41*e* and 43*e* are connected to the set and reset input nozzles 45*d* and 45*e*, respectively, by pipes 48 and 50. Output channel 45*b* is connected to delay line 47 by a pipe 51 and the output of the delay line is connected by a pipe 53 to input nozzle 41*a*. Output channel 45*c* is connected to delay line 49 by a pipe 55 and the output of the delay line is connected by a pipe 57 to input nozzle 43*a*.

A signal source 59 supplies the count signals and these signals are transmitted to nozzles 41*b* and 43*b* over the two branches of pipe 61. The count signals in this embodiment are represented by the presence of fluid flow in pipe 61.

While the counter stage is in its reset condition there is only one active path of fluid flow. The power stream applied to the flip-flop flows through 45*a*, 45*b*, 51, 47, 53, 41*a*, and 41*d* and vents to the atmosphere.

When the first count signal occurs at time T1 (FIGURE 4) fluid is applied from pipe 61 to nozzles 41*b* and 43*b*. The fluid applied to nozzle 43*b* passes through 43*c* and vents to the atmosphere. The fluid applied to nozzle 41*b* collides with the fluid emerging from nozzle 41*a* and the fluid from both nozzles is deflected into output channel 41*e*. The fluid flows from 41*e* through pipe 48 to set input nozzle 45*d* thus setting the flip-flop by deflecting its power stream into output channel 45*c*.

At time T2 the first count pulse terminates and fluid flow in channel 61 ceases. With no fluid being applied to nozzle 41*b* the fluid entering nozzle 41*a* is no longer deflected and assumes its normal path of flow through 41*d* to the vent.

Although the flip-flop changed state at time T1 and the signal conditions in output channels 45*b* and 45*c* were reversed at that time, delay elements 47 and 49 delay the signals so that the changed conditions are not evident at nozzles 41*a* and 43*a* until time T3. At T3 fluid ceases to flow into nozzle 41*a* from delay 47 and fluid begins to flow into nozzle 43*a* from delay 49.

The amount of delay introduced by elements 47 and 49 is governed by the same considerations as for the preceding embodiment. That is, they must delay a fluid signal for at least as long as the duration of the longest count signal but less than the interval of time elapsing between two consecutive count signals.

Figure 4:
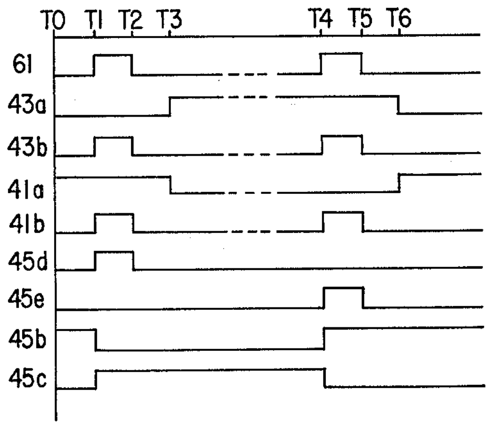

The second count signal may occur any time after the fluid signal from delay element 49 is applied to nozzle 41*a*. As shown in FIGURE 4 it occurs at time T4 when fluid again flows into pipe 61. A portion of the fluid entering pipe 61 flows through nozzle 41*b* and channel 41*c* to the vent. The remaining portion of the fluid entering pipe 61 flows into nozzle 43*b* and collides with the fluid entering the AND circuit through nozzle 43*a*. The two fluid streams are deflected into output channel 43*e* from whence they flow through pipe 50 to reset nozzle 45*e*.

The fluid entering the rest nozzle deflects the power stream of the flip-flop into output channel 45*b* and the flip-flop assumes the reset state.

At time T5 the second count pulse terminates and fluid ceases to flow in pipe 61 and nozzles 41*b* and 43*b*.

At time T4 when the flip-flop changed state its power stream ceased flowing into output channel 45*c* and began flowing into output channel 45*b*. These conditions are delayed in delay elements 47 and 49 and are not manifested at nozzles 41*a* and 43*a* until time T6. At this time fluid again flows from pipe 53 through nozzle 41*a* and channel 41*d* to the vent. Concurrently, fluid stops flowing into nozzle 43*a* from pipe 57. This completes one cycle of operation of the counter. A new cycle is initiated when a third count signal is applied to pipe 61.

The embodiment of FIGURE 2 has two advantages over the embodiment shown in FIGURE 1. First, it has only one active logic element thus requiring less power for producing power streams. Secondly, there are no crossover points and the entire counter stage including the connecting pipes may be formed in a single plane.

It should be noted that the word pipe as used herein is intended to cover tubes, ducts, channels, or other fluid conveying means defining a path for fluid flow. The working fluid may be air or another gas or water or another liquid.

The embodiments described herein show various output channels vented to the atmosphere. In some instances it may be desirable to connect some or all of these outputs to the return side of the source which supplies power stream fluid to the counter. Other modifications falling within the spirit and scope of the invention as defined by the appended claims will be obvious.

The embodiments of the invention in which an exclusive property or privilege is claimed are defined as follows:

1. A binary counter responsive to a sequence of fluid input signals for alternately producing fluid output signals at first and second outputs, said counter comprising: a fluid amplifier having a first stable state manifested by power stream flow to a first output and a second stable state manifested by power stream flow to a second output of said amplifier, said amplifier further including first and second control inputs for selectively directing said power stream to said first and second outputs, respectively; first and second fluid logic elements each having an output and first and second inputs; means connecting the output of said first logic element to the first control input of said amplifier and the output of said second logic element to the second control input of said amplifier; first delay means for conveying fluid from the first output of said amplifier to the first input of said first logic element; second delay means for conveying fluid from the second output of said amplifier to the first input of said second logic element; means for applying said sequence of fluid input signals to the second inputs of said logic elements and means for applying power streams to said logic elements, said first and second logic elements comprising first and second monostable fluid amplifiers biased such that their power streams are normally directed to their outputs when no fluid is applied to their first and second inputs.

2. A binary counter as claimed in claim 1 wherein each of said delay means includes means for delaying a fluid signal applied thereto for less than the interval of time between consecutive signals of said series but longer than the duration of a single signal of said series.

3. A fluid operated switch responsive to a sequence of fluid input signals for alternately producing fluid output signals at first and second outputs, said switch comprising: a bistable fluid amplifier having a power stream input; first and second control inputs, and first and second outputs; first and second fluid amplifier NOR circuits each having a power stream input, an output, and first and second control inputs for deflecting said power stream away from said output, means for applying said sequence of signals to the first control input of each of said NOR circuits; means connecting the output of each of said NOR circuits to one control input of said bistable amplifier; and dynamic delay means connecting the outputs of said bistable amplifier to said second control inputs of said NOR circuits, each of said delay means including means for delaying a fluid signal for less than the interval of time between consecutive signals of said series but longer than the duration of a single signal of said series.

4. A fluid switch comprising: a bistable fluid amplifier having a set and a reset state; a source for producing a sequence of fluid signals; first NOR circuit means responsive to said sequence of signals and a first delayed signal indicating that said bistable amplifier is reset for applying a set signal to said bistable amplifier; second NOR circuit means responsive to said sequence of signals and a second delayed signal indicating that said bistable amplifier is set for applying a reset signal to said bistable amplifier; said reset and set states being manifested by flow of a power stream to a first or a second output of said bistable amplifier; and first and second fluid signal delay means connected to said first and second outputs of said bistable amplifier to delay said power stream to thereby produce said first and second delayed signals.

5. A fluid switch as claimed in claim 4 wherein said first and second NOR circuits comprise monostable fluid amplifiers each biased such that their power streams normally produce said set and reset signals, each of said monostable amplifiers having first and second control inputs responsive to said sequence of signals and one of said delayed signals for inhibiting the production of said set or reset signals when either one or both of said control inputs is receiving fluid.

6. A fluid switch as claimed in claim 5 and further comprising means for continuously applying a power stream to each of said amplifiers.

7. A fluid switch as claimed in claim 6 and further comprising means for providing a physical manifestation of the state of said bistable amplifier.

8. A fluid switch as claimed in claim 4 wherein said set and said reset signals are manifested by fluid flow and said delayed signals and the signals of said sequence are manifested by the absence of fluid flow.

9. A binary counter for counting a sequence of fluid signals, said counter comprising: a bistable fluid amplifier having set and reset states manifested by flow of a power stream to a first or a second output; first logic circuit means responsive to said sequence of fluid signals and a first delayed signal indicating that said bistable amplifier is reset for applying a set signal to said amplifier; second logic circuit means responsive to said sequence of fluid signals and a second delayed signal indicating that said bistable amplifier is set for applying a reset signal to said bistable amplifier; and first and second fluid signal delay means connected to said first and second outputs of said bistable amplifier to delay said power stream to thereby produce said first and second delayed signals; and means for applying a power stream to said amplifier.

10. A binary counter responsive to a sequence of fluid input signals for alternately producing fluid output signals at first and second outputs, said counter comprising: a fluid amplifier having a first stable state manifested by power stream flow to a first output and a second stable state manifested by power stream flow to a second output of said amplifier, said amplifier further including first and second control inputs for selectively directing said power stream to said first and second outputs, respectively; first and second fluid logic elements each having a single signal output and first and second inputs; means connecting the output of said first logic element to the first control input of said amplifier and the output of said second logic element to the second control input of said amplifier; first delay means for conveying fluid from the first output of said amplifier to the first input of said second logic element; second delay means for conveying fluid from the second output of said amplifier to the first input of said first logic element; and means for applying said sequence of fluid input signals to the second inputs of said logic elements.

11. A binary counter as claimed in claim 10 wherein each of said delay means includes means for delaying a fluid signal applied thereto for less than the interval of time between consecutive signals of said series but longer than the duration of a single signal of said series.

12. A binary counter comprising: a bistable fluid amplifier having a set state and a reset state manifested by flow of a power stream to a first or a second output, respectively, said amplifier having set and reset input nozzles to which fluid may be selectively applied to cause said amplifier to change state; a first fluid AND circuit having two inputs and an output connected to said set input nozzle; a second fluid AND circuit having two inputs and an output connected to said reset input nozzle; first signal delay means connecting the second output of said bistable amplifier to one input of said first AND circuits; second signal delay means connecting the first output of said bistable amplifier to one input of said second AND circuit; and means for applying a sequence of count pulses to the second input of each of said AND circuits.

References Cited by the Examiner

UNITED STATES PATENTS

| | | | |
|---|---|---|---|
| 3,107,850 | 10/1963 | Warren et al. | 235—201 |
| 3,128,040 | 4/1964 | Norwood | 235—201 |

OTHER REFERENCES

Boothe et al.: "A Suggested System of Schematic Symbols," pp. 437–447, Fluid Amplification Symposium, Diamond Ordnance Fuze Lab., 1962, Received in Scientific Library, April 11, 1963.

Grubb: "Fluid Logic Shift Register," IBM Technical Disclosure Bulletin, page 24, vol. 6, No. 1, June 1963.

Mitchell (1): "Fluid Binary Counter," IBM Technical Disclosure Bulletin, page 30, vol. 6, No. 2, July 1963.

LEO SMILOW, *Primary Examiner.*